(12) United States Patent
Jong et al.

(10) Patent No.: US 6,487,114 B2
(45) Date of Patent: Nov. 26, 2002

(54) METHOD OF READING TWO-BIT MEMORIES OF NROM CELL

(75) Inventors: Fuh-Cheng Jong, Tainan (TW); Kent Kuohua Chang, Taipei (TW)

(73) Assignee: Macronix International Co., Ltd. (TW)

( * ) Notice: Subject to any disclaimer, the term of this patent is extended or adjusted under 35 U.S.C. 154(b) by 0 days.

(21) Appl. No.: 09/795,937

(22) Filed: Feb. 28, 2001

(65) Prior Publication Data

US 2002/0118566 A1 Aug. 29, 2002

(51) Int. Cl.$^7$ ................................................ G11C 16/04
(52) U.S. Cl. ........................... 365/185.03; 365/185.14; 365/185.24
(58) Field of Search .................... 365/185.03, 185.24, 365/185.14, 185.05

(56) References Cited

U.S. PATENT DOCUMENTS 6,011,725 A * 1/2000 Eitan ..................... 365/185.33
6,292,394 B1 * 9/2001 Cohen et al. .......... 365/185.19
6,320,786 B1 * 11/2001 Chang et al. .......... 365/185.03

* cited by examiner

*Primary Examiner*—Richard Elms
*Assistant Examiner*—Hien Nguyen
(74) *Attorney, Agent, or Firm*—Powell Goldstein Frazer & Murphy LLP

(57) ABSTRACT

A method of reading two-bit information in Nitride Read only memory (NROM) cell simultaneously. According to outputted voltage in drain or source of the NROM, it can identify a logical two-bit combination massage of the NROM. The method includes: grounding the source of the NROM; inputting a voltage to the drain of the NROM; inputting a voltage to the gate of the NROM; measuring the outputted current of drain or source; and dividing the outputted current into four different zones, and each zone represents a specific logical two-bit information, which is "0 and 0", "0 and 1", "1 and 0", or "1 and 1".

28 Claims, 6 Drawing Sheets

METHOD OF READING TWO-BIT MEMORIES OF NROM CELL

FIELD OF THE INVENTION

The present invention relates to a method of reading logical information in NROM cell and more particularly to read two-bit logical information simultaneously in NROM cell.

BACKGROUND OF THE INVENTION

Memory device for non-volatile storage of information are currently in widespread use today, being used in a myraid applications. A few examples of non-volatile semiconductor memory include read only memory (ROM), programmable read only memory(PROM), erasable programmable read only memory (EPROM), electrical erasable programmable read only memory (EEPROM) and flash EEPROM.

Semiconductor ROM devices, however, suffer from the disadvantage of not being electrically programmable memory devices. The programming of a ROM occurs during on the steps of manufacture using special masts containing the data to be stored. Thus, the entire contents of a ROM must be determined before manufacture. In addition, because ROM devices are programmed during manufacture, the time delay before the finished product is available could be six weeks or more. The advantage, however, of using ROM for data storage is the low cost and small space per device. However, the penalty is the inability to change data once the masks are committed to. If mistakes in the date programming are found they are typically very costly to correct. Any inventory that exists having incorrect data programming is instantly obsolete and probably cannot be used. In addition, extensive time delays are incurred because new masks must first be generated from scratch and the entire manufacturing process repeated. Also, the cost savings in the use of ROM memories only exist if large quantities of the ROM are produced.

Moving to EPROM semiconductor devices eliminates the necessity of mask programming the date the complexity of the process increases drastically. In addition, the die size is larger due to the addition of programming circuitry and there are more processing and testing steps involve in the manufacture of these types of memory devices. Advantage of EPROMs is that they are electrically programmed but for erasing, EPROMs require exposure to ultraviolet (UV) light. These devices are constructed with windows transparent to UV light to allow the die to be exposed for erasing, which must be performed before the device can be programmed. A major drawback to these devices is that they lack the ability to be electrically erased. In many circuit designs it is desirable to have a non-volatile memory device that can be erased and reprogrammed in-circuit, without the need to remove the device for erasing and reprogramming.

Semiconductor EEPROM devices also involve more complex processing and testing procedures than ROM, but have the advantage of electrical programming and erasing. Using EEPROM devices in circuitry permits in-circuit erasing and reprogramming of the device, a feat not possible with conventional EPROM memory. Flash EEPROMs are similar to EEPROMs in that memory cells can be programmed and erased electrically but with the additional ability of erasing all memory cells at once, hence the term flash EEPROM. This disadvantage of flash EEPROM is that it is very difficult and expensive to manufacture and produce.

The widespread use of EEPROM semiconductor memory has prompted much research focusing on constructing better memory cells. Active areas of research have focused on developing a memory cell that has improved performance characteristics such as shorter programming times, utilizing lower voltages for programming and reading, longer data retention times, shorter erase times and smaller physical dimensions. One such are of research involves a memory cell that has an insulted gate.

For obtaining a high-density memory cell, the traditional form EEPROM cell has been modified to a different configuration, Nitride Read Only Memory (NROM). Please now referring the FIG. 1 to illustrate that NROM cell includes a substrate 10 with doped source 12 and drain 14, ONO structure 16 wherein silicone nitride 17 is sandwished between two silicon oxide layers 18 and 20 over the substrate 10, a gate conductor 22 over the ONO 16, and channel 15 under ONO 16 between drain 14 and source 12. The programming of NROM is based on the charge is captured by non-conductor charge-trapping layer 17 between two silicone oxide layers. The two-bit memory individually stored in both end of the charge-trapping layer 17. If the memory is programming, a hot charge is trapped as it is injected into the charge-trapping layer 17. Here the charge-trapping layer 17 serves as the memory retention layer. More specifically, if providing a programming voltage to source 12, drain 14 and gate 22, the hot charges tend to flow inward the drain 14. During the charge is been injecting into the ONO 16, hot charges go through the lower $SiO_2$ layer 20 then to gather in the $Si_3N_4$ 17 and it is very obvious if the lower $SiO_2$ layer 20 is thin. The gathered charge in charge-trapping layer 17 is marked as 24. Once the charges are trapped and gathered in charge-trapping layer 17, the gathered charge 24 will move to the region in the charge-trapping layer 17 near drain 14 to change the threshold voltage. The threshold voltage of the portion of the channel under the region of trapped charge increases as more electrons are injected into the $Si_3N_4$ layer 17, and it leads decreasing the current. If the electrons are injected and trapped in $Si_3N_4$ 17, the logical information signal is "0"; if there is no electron in the $Si_3N_4$ 17, the logical information signal is "1".

One significant characteristic of NROM is that not only the end region of the charge-trapping layer 17 near drain 14 can be programmed and erased as a bit, but also the other end of region near source 12 can be programmed and erased as another bit. For conventional stacked type ROM, electron is stored in polysilicon layer, which is a good conductor. The electrons in polysilicon layer move within easily, so each cell has one bit memory only. However, in NROM cell, electrons are stored in non-conductor layer, $Si_3N_4$. Since electrons cannot move freely in $Si_3N_4$, both of right and left ends of $Si_3N_4$ layer are used for different one bit memories, so each NROM cell have two bit memories. NROM is applied in semiconductor industry to eliminate the volume of memory, and it leads to produce dense structure semiconductor.

U.S. Pat. No. 6,011,725 issued to Boaz Eitan (inventor), explains reading NROM can be in forward direction or reverse direction. Mostly common is by reverse direction because programming times can be shortened. This permits a much narrower charge-trapping region. This in turn increases the erase efficiency since fewer electrons need to be removed to erase the device.

Reading in the reverse direction means reading in a direction opposite that of programming. In other word, voltages are applied to the source and the gate and the drain is grounded. Since nitride is non-conductor, the trapped charge remains localized to the region near drain, for example, the right bit. The threshold voltage rises, for example to 4V only in the portion of the channel under the trapped charges. However, in the prior art, each bit memory in NROM is read independently. Nevertheless, reading a cell by two independent processes wastes time and needs a complication circuit structure. That will be very helpful if there is a method to read two bit memories in a cell by only one process.

SUMMARY OF THE INVENTION

Therefore, it is an object of the present invention to provide a reading method for NROM cell to read forward direction and reverse direction two bit memories simultaneously.

It is another object of the present invention to provide a fast and convenient reading method for NROM cell.

Yet, another object of the present invention is to provide a reading method for NROM cell by a simple circuit design.

The present invention discloses a method for reading a Nitride Read Only Memory that reads two bits logical information in NROM simultaneously. The method comprises the steps of: grounding the source make the voltage to 0; inputing a constant voltage to the drain; inputing a constant voltage to the gate; measuring the output current of the source or drain; and dividing the output current of drain or source into four different zones, and each zone represents a specific logical two-bit information, which is "0 and 0", "0 and 1", "1 and 0", or "1 and 1".

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The present invention starts from grounding the source of NROM cell to decrease its voltage to zero, and then the two bit memories logical information is obtained by analyzing the reaction of NROM cell during inputting voltage to the gate and the drain. So reading the two bit memories once together is without the exchanging between drain and source to simplify the circuit and to save reading time. In the experiment of the present invention, the instrument model HP4145 is utilized to measure the relationship between input and output currents.

Figure 1:
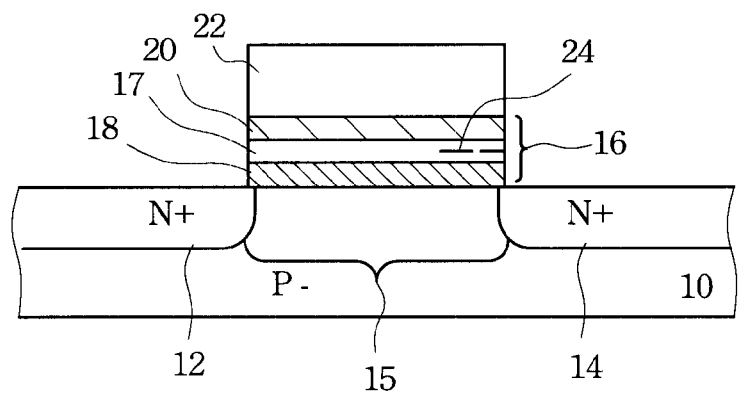
FIG. 1 illustrates a sectional view of a NROM cell structure.
Figure 2:
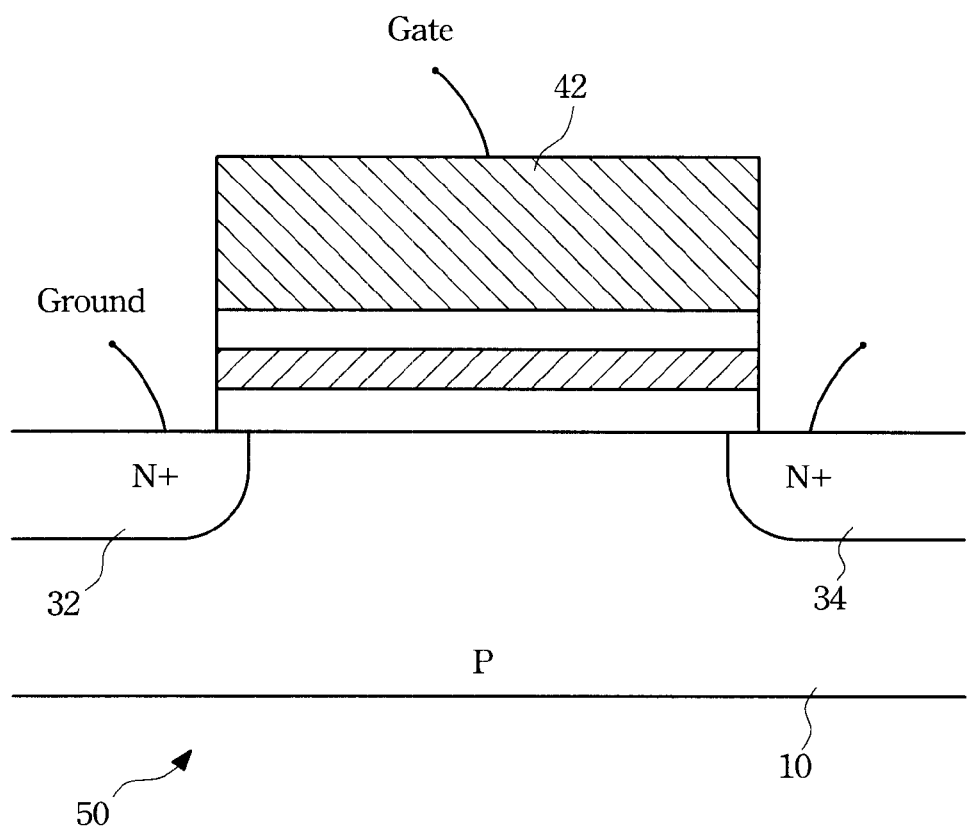
FIG. 2A illustrates a sectional view of a NROM wherein no electron in both extremity regions in charge-trapping layer.
FIG. 2B shows the source outputted current for a NROM wherein no electron in both extremity regions in charge-trapping layer.
Figure 2B:
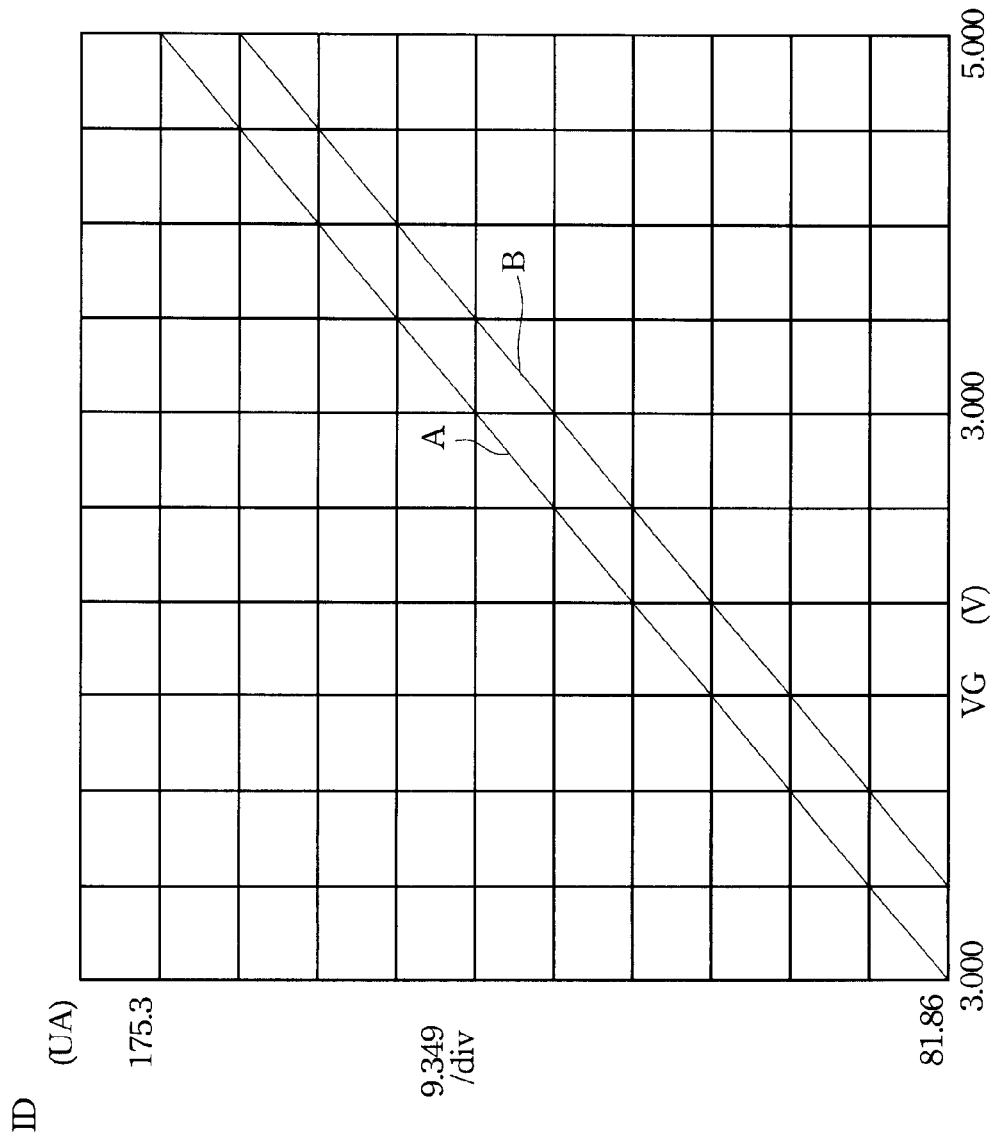

As referring to FIG. 2A, in the embodiment of the present invention, it shows the condition of no electron in both side ends of charge-trapping layer of NROM. The reading method begins from grounding a electrode next to the gate, for example the left side of the gate, to identify it as source 32 to decrease its voltage to approximately zero. Next, inputting constant voltage to the right electrode, drain 34, such as 2.5 voltage and also inputting voltage to the gate 42, for example, between 3 and 5 voltage. While voltage is kept inputting, the gate current is measured once the increasing 0.1 voltage in gate, and the result is shown as A line in FIG. 2B. If grounding the right electrode of the gate and inputting voltage to the left electrode of the gate and the gate (not shown), the current from left electrode of the gate is measured to shown as B line of FIG. 2B. In FIG. 2B, the line A overlaps line B to represents that grounding any electrode results similarly. In the embodiment of the present invention, if the gate is inputted 5 voltage, the current of the drain is measured to about $168.8 \times 10^{-6}$ to $175.3 \times 10^{-6}$ ampere. During this current output condition, the logical information of left side gate and right side gate of the NROM are "1" and "1" respectively.

Figure 3:
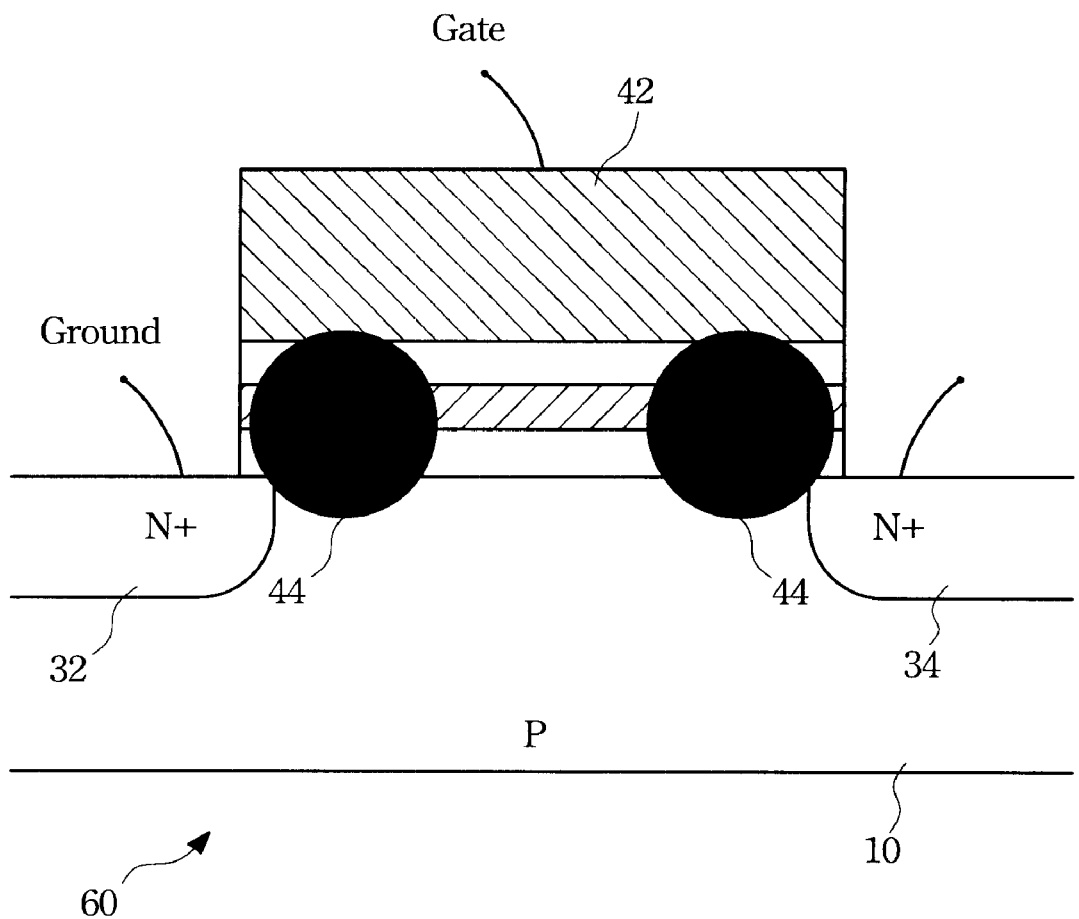
FIG. 3A illustrates a sectional view of a NROM wherein gathered electrons in both extremity regions in charge-trapping layer.
FIG. 3B shows the source outputted current for a NROM wherein gathered electron in both extremity regions in charge-trapping layer.
Figure 3B:
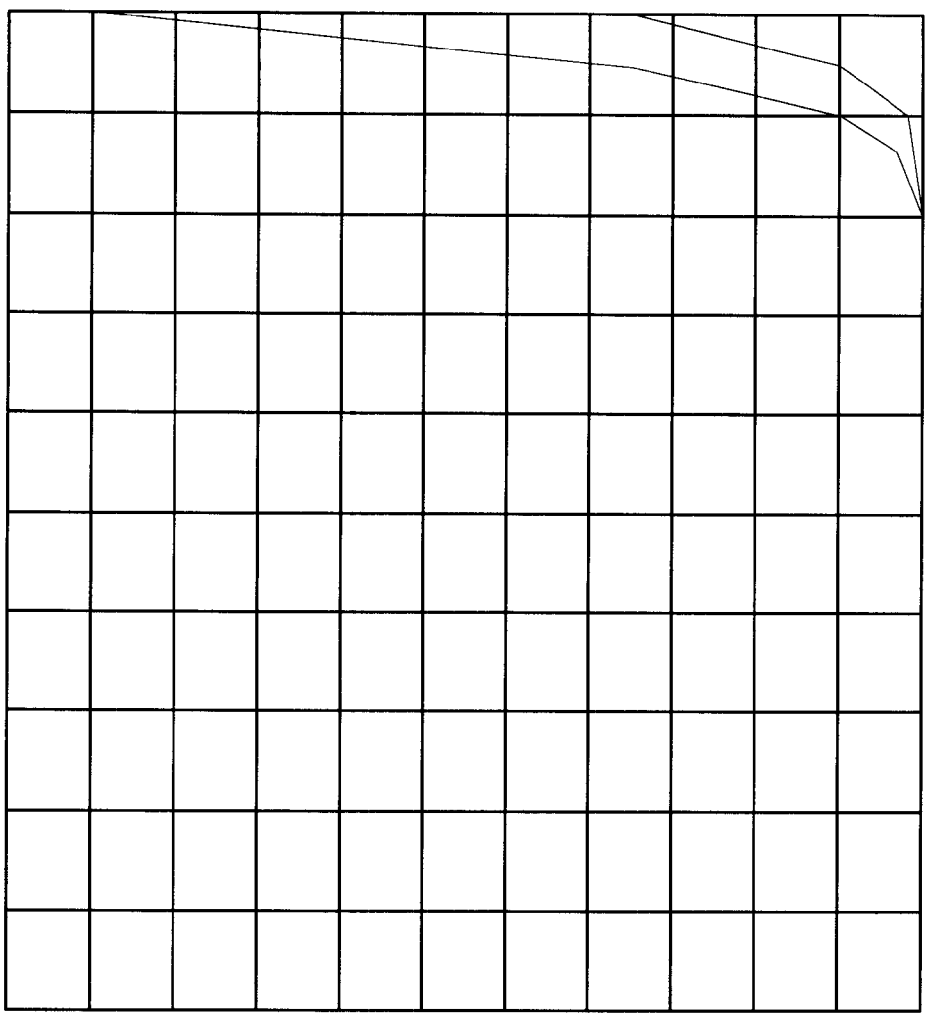

Referring to FIG. 3A, it illustrates NROM cell 60 with electrons 44 in the both side ends of charge-trapping layer in the same voltage inputting condition. In this embodiment of the present invention, if the gate 42 is inputted 5 voltage and the drain 34 is inputted 2.5 voltage, the measured current of the drain is much lower comparatively, and it is about less than $175 \times 10^{-9}$ ampere, as FIG. 3B. During this current output condition, the logical information of left side gate and right side gate of the NROM are "0" and "0" respectively.

Figure 4:
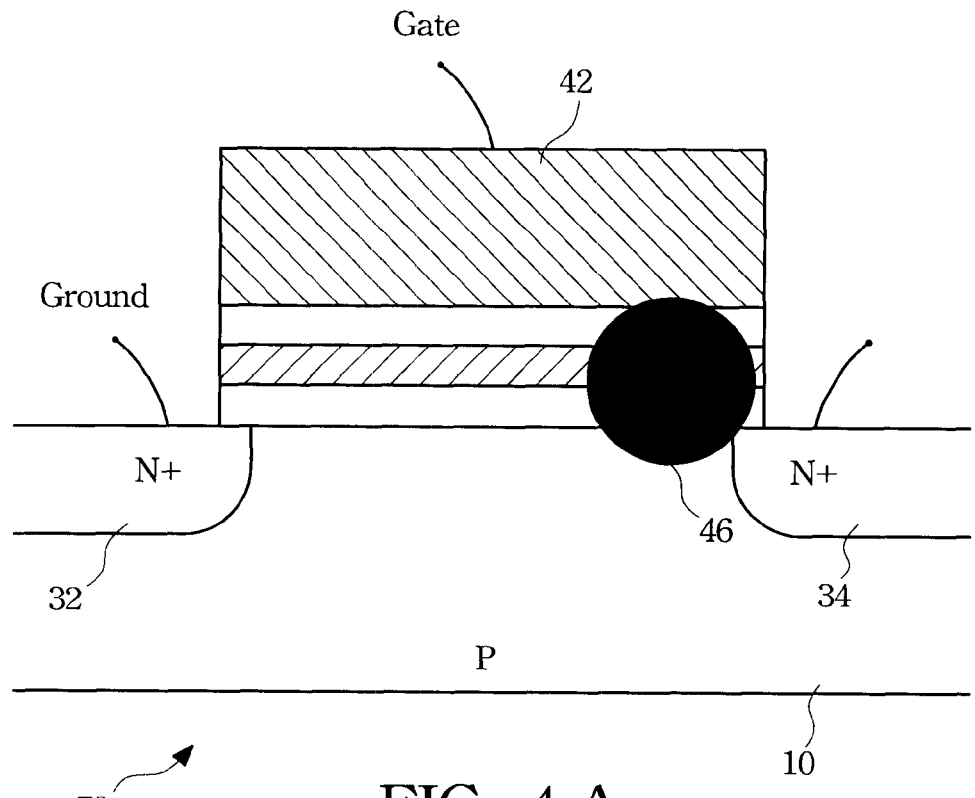
FIG. 4A illustrates a sectional view of a NROM wherein gather electrons in the right extremity region in charge-trapping layer.
FIG. 4B illustrates a sectional view of a NROM wherein gather electrons in the left extremity region in charge-trapping layer.
FIG. 4C illustrates the source outputted current for a NROM wherein gathered electron in one extremity region in charge-trapping layer.
Figure 4:
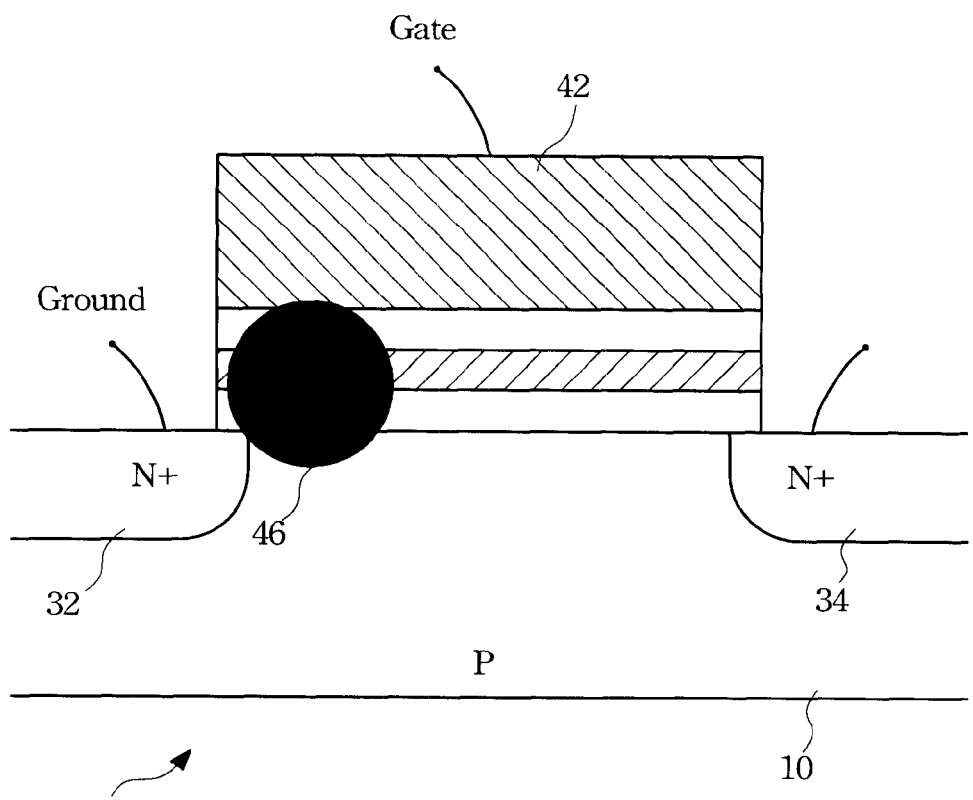

In another embodiment of the present invention, as referring to FIG. 4A, illustrates the NROM cell 70 with only right side end of charge-trapping layer. The reading method begins from grounding a electrode next to the gate, for example the left side of the gate, to identify it as source 32 to decrease its voltage to zero. Next, inputting constant voltage to the right electrode, drain 34, such as 2.5 voltage and also inputting voltage to the gate 42, for example, between 3 and 5 voltage. While voltage is kept inputting, the gate current is measured once the increasing 0.1 voltage in gate, and the result is shown as E line in FIG. 4C. In the embodiment of the present invention, if the gate is inputted 5 voltage, the current of the drain is measured to about $45.6 \times 10^{-6}$ ampere. During this current output condition, the logical information of left side gate and right side gate of the NROM are "1" and "0" respectively.

In the embodiment of the present invention as shown in FIG. 4B, NROM cell 80 with electrons 46 in the right side end of charge-trapping layer in the same voltage inputting condition. In this embodiment of the present invention, if the gate 42 is inputted 5 voltage and the drain 34 is inputted 2.5 voltage, the measured current of the drain is about $3.28 \times 10^{-6}$ ampere, as F line in FIG. 4C. During this current output condition, the logical information of left side gate and right side gate of the NROM are "0" and "1" respectively.

Figure 4C:
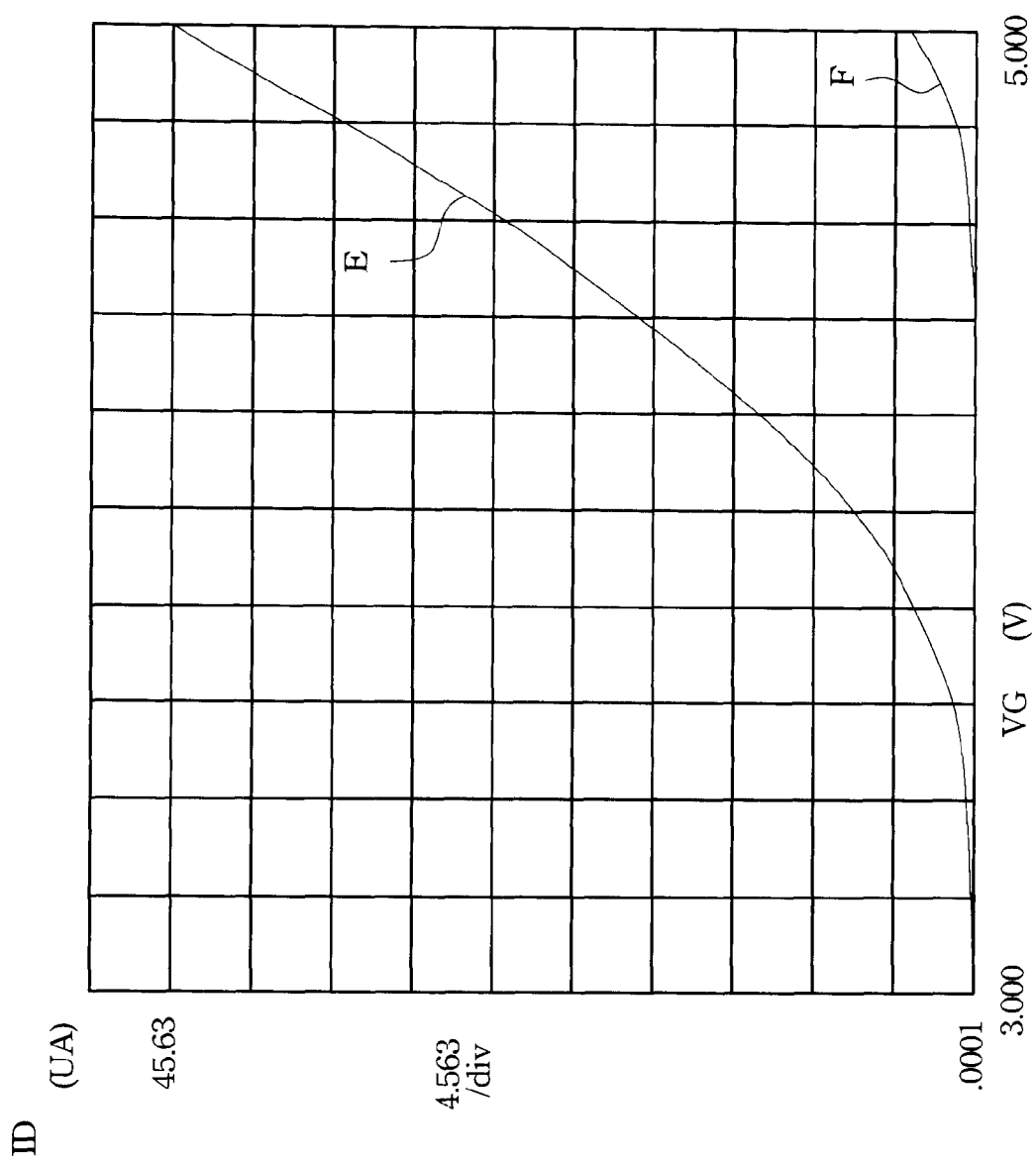

In FIG. 4C, the line E and line F are not overlap, and it shows a apparent difference between these two results, so the logical information of the NROM cell can also be identified by it.

According to the previous operations of the embodiment of the present invention, two bit memories of a NROM can be read by one direction. In the condition of grounding the source and inputting proper voltage to the drain and to the gate, a outputted current of either drain or source is test. Based on the quantity, the outputted current can be identified into four regions, which are "0" and "0", "0" and "1", "0" and "1", and "1" and "1". The identification work can be done by a simple design sense amplifier, which sense the outputted current to determine two bit memories information of the NROM.

It is significant to note that the outputted current discussed above can be either drain current or source current. In the embodiment of the present invention, the current of non-grounding region (i.e. drain) is measured for the NROM reading method. However, the not only the current of non-grounding region but also the current of grounding region (i.e. source) can be used for recognized the NROM memories.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A method of reading two bits logical information simultaneously in Nitride Read Only Memory (NROM) cell, said method comprising the steps of:

grounding a first electrode of said NROM to make the voltage of the first electrode to 0;

inputing a first voltage to a second electrode of said NROM;

inputing a second voltage to the gate of said NROM;

measuring the output current of said first electrode of NROM; and analyzing said output current to divide into four different zones by the quantity of said output current, each of said four different zones represents a specific signal combination of said two bits logical information of said NROM cell.

2. The method in claim 1, wherein said NROM is a programable and erasable read-only memory, and said NROM can store two bits logical information simultaneously.

3. The method in claim 1, wherein said first electrode of said NROM is drain or source.

4. The method in claim 3, wherein if said first electrode of said NROM is drain, said second electrode is source.

5. The method in claim 3, wherein if said first electrode of said NROM is source, said second electrode is drain.

6. The method in claim 1, wherein said first voltage is about from 3 to 5 voltage.

7. The method in claim 1, wherein said second voltage is about from 2 to 4 voltage.

8. The method of claim 1, wherein said specific signal combination of said two bit logical information is "0" and "0", "0" and "1", "0" and "1", or "1" and "1".

9. A method of reading two bits logical information simultaneously in Nitride Read Only Memory (NROM) cell, said method comprising the steps of:

grounding a first electrode of said NROM to make the voltage of the first electrode to 0;

inputing a first voltage to a second electrode of said NROM;

inputing a second voltage to the gate of said NROM;

measuring the output current of said second electrode of NROM; and analyzing said output current to divide into four different zones by the quantity of said output current, each of said four different zones represents a specific signal combination of said two bits logical information of said NROM cell.

10. The method in claim 9 wherein said NROM is a programable and erasable read-only memory, and said NROM can store two bits logical information simultaneously.

11. The method in claim 9, wherein said first electrode of said NROM is drain or source.

12. The method in claim 11, wherein if said first electrode of said NROM is drain, said second electrode is source.

13. The method in claim 11, wherein if said first electrode of said NROM is source, said second electrode is drain.

14. The method in claim 11, wherein said first voltage is about from 3 to 5 voltage.

15. The method in claim 11, wherein said second voltage is about from 2 to 4 voltage.

16. The method of claim 9, wherein said specific signal combination of said two bit logical information is "0" and "0", "0" and "1", "0" and "1", or "1" and "1".

17. A method of reading two bits logical information simultaneously in Nitride Read Only Memory (NROM) cell, said method comprising the steps of:

grounding a first electrode of said NROM to make the voltage of the first electrode to 0;

inputing a first voltage to a second electrode of said NROM;

inputing a second voltage to the gate of said NROM;

measuring the output current of said first electrode of NROM; and analyzing said output current to divide into four different zones by the quantity of said output current, each of said four different zones represents a specific signal combination of said two bits logical information, which is "0" and "0", "0" and "1", "0" and "1", or "1" and "1".

18. The method in claim 17, wherein said first electrode of said NROM is drain or source.

19. The method in claim 18, wherein if said first electrode of said NROM is drain, said second electrode is source.

20. The method in claim 18, wherein if said first electrode of said NROM is source, said second electrode is drain.

21. The method in claim 17, wherein said first voltage is about from 3 to 5 voltage.

22. The method in claim 17, wherein said second voltage is about from 2 to 4 voltage.

23. A method of reading two bits logical information simultaneously in Nitride Read Only Memory (NROM) cell, said method comprising the steps of:

grounding a first electrode of said NROM to make the voltage of the first electrode to 0;

inputing a first voltage to a second electrode of said NROM;

inputing a second voltage to the gate of said NROM;

measuring the output current of said second electrode of NROM; and analyzing said output current to divide into four different zones by the quantity of said output current, each of said four different zones represents a specific signal combination of said two bits logical information, which is "0" and "0", "0" and "1", "0" and "1", or "1" and "1".

24. The method in claim 23, wherein said first electrode of said NROM is drain or source.

25. The method in claim 24, wherein if said first electrode of said NROM is drain, said second electrode is source.

26. The method in claim 24, wherein if said first electrode of said NROM is source, said second electrode is drain.

27. The method in claim 23, wherein said first voltage is about from 3 to 5 voltage.

28. The method in claim 23, wherein said second voltage is about from 2 to 4 voltage.

* * * * *